US005292594A

United States Patent [19]

Liburdi et al.

[11] Patent Number: 5,292,594
[45] Date of Patent: Mar. 8, 1994

[54] TRANSITION METAL ALUMINUM/ALUMINIDE COATINGS

[75] Inventors: Joseph Liburdi, Hamilton; Paul Lowden, Cambridge; Alina Aguero, Guelph, all of Canada

[73] Assignee: Liburdi Engineering, Ltd., Canada

[21] Appl. No.: 867,641

[22] Filed: Apr. 13, 1992

Related U.S. Application Data

[62] Division of Ser. No. 572,598, Aug. 27, 1990, Pat. No. 5,139,824.

[51] Int. Cl.$^5$ .............................................. B32B 15/01
[52] U.S. Cl. ................................. 428/650; 428/652; 428/655; 428/669; 428/670; 428/672; 428/610; 428/941
[58] Field of Search ............... 428/652, 669, 670, 672, 428/655, 941, 610, 650; 416/241 R

[56] References Cited

U.S. PATENT DOCUMENTS

| 1,571,540 | 2/1926 | Davignon | 428/670 |
| 3,476,586 | 11/1969 | Valtchev et al. | 428/652 |
| 3,489,538 | 1/1970 | Cook | 428/655 |
| 3,794,511 | 2/1974 | Baranow | 428/655 |
| 3,961,910 | 6/1976 | Baladjanian et al. | 428/652 |
| 3,979,273 | 9/1976 | Panzera et al. | 204/192.15 |
| 3,985,515 | 10/1976 | Greeson et al. | 428/670 |
| 3,999,956 | 12/1976 | Stueber et al. | 428/670 |
| 4,008,084 | 2/1977 | Ikeda et al. | 428/652 |
| 4,198,442 | 4/1980 | Gupta et al. | 428/678 |
| 4,501,776 | 2/1985 | Shankar | 427/253 |
| 4,526,814 | 7/1985 | Shankar et al. | 427/253 |
| 4,687,684 | 8/1987 | Restall et al. | 427/248.1 |
| 4,880,614 | 11/1989 | Strangman et al. | 428/623 |
| 4,933,239 | 6/1990 | Olson et al. | 428/557 |
| 4,962,005 | 10/1990 | Alperine et al. | 428/670 |

FOREIGN PATENT DOCUMENTS

| 7675 | 2/1980 | European Pat. Off. | 428/678 |
| 711742 | 7/1954 | United Kingdom | 428/652 |

OTHER PUBLICATIONS

International Search Report in International Application No. PCT/US90/07149 dated Jul. 29, 1991.
Journal American Chemical Society, vol. 110 (1988), pp. 2688-2689, J. Gozum, et al.
Polyhedron, vol. 8, No. 4, (1989), pp. 551-553, R. Kumar, et al.
Patent Classification Definitions-Dec. 1987-Class 428; Stock Material, pp. 428-1, 428-6, 7.

Primary Examiner—Michael Lewis
Assistant Examiner—N. M. Nguyen
Attorney, Agent, or Firm—Morgan & Finnegan

[57] ABSTRACT

The present invention is designed to improve a method of deposition of coatings upon a metal or alloy substrate. The coating comprises aluminum or aluminide material interdiffused with a transition metal deposited by chemical vapor deposition which utilizes organometallic precursors to facilitate the deposition of the transition metal. The improvement permits better control of the process and permits coating of complex substrates including those with internal passages or holes. In the embodiment involving a first deposition of aluminum or aluminide coating, applicants have achieved deposition thereon of the transition metal. Platinum is the preferred transition metal to be used in the subject method. A product is taught. This product can be a component from a gas turbine engine.

2 Claims, No Drawings

TRANSITION METAL ALUMINUM/ALUMINIDE COATINGS

This is a divisional of co-pending application Ser. No. 07/572,598 filed Aug. 27, 1990, U.S. Pat. No. 5,139,824.

FIELD OF THE INVENTION

This invention relates to a process for the protective treatment of complex substrates to increase their corrosion and oxidation resistance. More particularly, this invention relates to coatings and to a method for making those coatings. A practical use of the coatings is for gas turbine engine components.

BACKGROUND OF THE INVENTION

Protective diffusion layers are particularly advantageous for gas turbine engine components. Such components are subject to high temperatures and oxidizing and hot corrosive environments. Further, many of these parts have complex and intricate designs.

It is already known that aluminide coatings increase the life expectancy of parts made with high temperature alloys when they are exposed to oxidation and corrosion. Currently, these coatings are produced principally by pack cementation and gas-phase chemical vapor deposition. For example, it is known to apply a diffusion layer of aluminum in nickel, cobalt and iron-base alloy parts by pack cementation processes. These involve packing such parts in a bed of powdered mixture consisting of a source of aluminum and an inert filler material and heated to an elevated temperature, for example, 750° to 1100° C., for several hours to diffuse and build up a layer of aluminum on the surfaces of the alloy parts being treated. See U.S. Pat. No. 4,156,042 and K. Brennfleck, PROC. INTERN. CONFERENCE ON CVD, p. 578 (1979).

Regarding more complex structures, U.S. Pat. No. 4,148,275 teaches to diffusion aluminize hollow tubes or the like using a CVD process by connecting the hollow portions to a manifold and to force a carrier gas over a heated bed of a mixture of a source of aluminum and an inert filler and into the hollow portions to carry a portion of volatilized aluminum into the passages.

An alternative CVD method for coating internal channels is the use of organometallics as the vapor transport species. Experimental work with aluminum alkyls has shown that it is capable of satisfactorily coating the walls of channels down to a diameter of 0.25 mm (see J. E. Restall in ALTERNATIVE PROCESSES AND TREATMENTS, Mat. Sci. Technol. 2, 226-231 (1986).

Ion Vapor Deposition (IVD) is a process combining vacuum evaporation and sputtering to also achieve such coatings. This known process is described in G. Rudzki, SURFACE FINISHING SYSTEMS, p. 161 (1983).

Electroplating is an electrochemical process conducted in a solution resulting in the deposition of a is coating on an electrode (see G. Rudzki, Surface Finishing Systems, p. 45 (1983)).

Electrophoretic deposition, which is analogous to electroplating involves the coagulation of resins on the electrode and can be employed to deposit aluminum, as described by T. P. Fisher, Surface Technology, 12, 107 (1981).

It is equally known that the presence of transition metals such as platinum and yttrium is useful. Nevertheless, to date, there are a few methods of applying transition metals to the parts. For instance, CVD from noble metal halides is not efficient due to the proximity of the volatilization and decomposition temperatures (see C. F. Powell in VAPOR DEPOSITION, John Wiley and Sons, New York, p. 310 (1966)). Equally, very few studies of metal-organic deposition have been reported, largely because of the lack of suitable volatile and reactive molecular precursors capable of producing uncontaminated films (see M. Rand, CHEMICAL VAPOR DEPOSITION OF THIN-FILM PLATINUM, J. Electrochem. Soc., 120, 686-693, (1973) and J. Gozum, TAILORED ORGANOMETALLICS AS PRECURSORS FOR THIN CHEMICAL VAPOR DEPOSITION OF HIGH-PURITY PALLADIUM AND PLATINUM FILMS, J. Am. Chem. Soc., 110, 2688-2689 (1988).

The most common method of platinum deposition is electroplating. In a preferred method, the platinum group metal is applied first, and is diffused at the same time as the aluminum is deposited. Vapor deposition is a technique listed but not exemplified to deposit the platinum group metal. Rather, electro-deposition was exemplified. See British Patent No. 1,210,026 and U.S. Pat. No. 4,501,776.

Similarly, U.S. Pat. No. 3,677,789 proposes to improve the oxidation and corrosion resistance of such articles by first coating the alloy part with a platinum group metal by electro-deposition or other means. Then, the patent teaches to aluminize the platinum plated part by pack cementation.

Recently, a method has been discovered for forming protective diffusion layers on nickel, cobalt and ironbase alloy parts. It comprises the formation of a diffusion layer of platinum, chromium and aluminum on surfaces, either by deposition of platinum and gas phase chrominizing followed by aluminizing or gas phase chrominizing and deposition of platinum followed by aluminizing and deposition of platinum. Simply, this method is directed to a sandwich structure which includes a chromium layer as an intermediate to facilitate the adhesion of a platinum layer to aluminum. Electrodeposition of platinum is a preferred technique, although vapor deposition is mentioned but not exemplified. See U.S. Pat. No. 4,526,814.

Chemical vapor deposition is a process of obtaining an element in solid form by decomposition of a gaseous compound. This is radically different from the physical process of vapor deposition, which is the physical process of condensing elemental vapors. While electroplating and vapor deposition are line-of-sight processes, chemical vapor deposition permits coating of complex structures including the cooling internal passages of the blades. It would be desirable to deposit transition metals to obtain modified coatings into these passages.

Recently, R. Kumar, NEW PRECURSORS FOR CHEMICAL VAPOR DEPOSITION OF PLATINUM AND THE HYDROGEN EFFECT ON CVD, Polyhedron, 551 (1988) and H. D. Kaesz, LOW TEMPERATURE OMCVD FOR PLATINUM, Adv. Coat. Surf. Tech., 2,3 (1989) have been able to deposit clean platinum films utilizing new precursors that decompose under mild conditions; the presence of hydrogen in order to obtain pure films is emphasized by the authors.

Fortunately, applicants have discovered a method which overcomes the deficiencies of prior art in preparing modified aluminide coatings on complicated structures and in coating platinum or a transition metal directly on aluminum or aluminide without the necessity of using intermediates to facilitate such bonding.

SUMMARY OF THE INVENTION

The invention relates to a method for coating complex substrates comprising: (a) depositing a transition metal or mixture thereof on a metal or alloy substrate by a chemical vapor deposition technique using an organometallic compound; (b) depositing an aluminum or aluminide or mixture thereof on the metal or alloy substrate; (c) interdiffusing the deposited material; and (d) recovering a coated article with the deposited materials adhered thereto.

The invention further relates to a method for coating a substrate comprising: (a) depositing an aluminum or aluminide or mixture thereof on the substrate; then (b) depositing a transition metal or mixture thereof on the substrate by chemical vapor deposition using an organometallic compound; (c) interdiffusing the deposited material; and (d) recovering a coated article with the deposited materials adhered thereto.

The invention also relates to a coated product comprising a substrate having a first coating of an aluminum or aluminide or mixture thereof, and a second coating thereon of a chemical vapor deposited transition metal or mixture thereof whereby the transition metal is adhered to the aluminum or aluminide first coating.

DETAILED DESCRIPTION OF THE INVENTION

As mentioned, this invention is designed to improve methods of depositing a transition metal group permitting better control of such processes.

The process comprises three steps. The first step is the deposition of a metallic element onto a substrate heated between 100° and 1200° C. at a pressure of $10^{-5}$ to $10^{-2}$ atmospheres for a range of time from 10 minutes to 10 hours. Organometallic precursors are reacted at the substrate surface, which results in a chemical vapor deposition reaction and the deposition of the metallic element. The precursors can be an organometallic compound where the temperature of decomposition of this compound is greater than the temperature at which it is volatile under the processing conditions. The process may be carried out in the presence of a inert carrier gas or a reducing gas such as hydrogen or hydrocarbon gas used as a carrier.

The second step of the process comprises an aluminum or aluminide deposition which may be performed by several methods:

a) a pack cementation process carried out between 750° and 1200° C. for 2 to 16 hours. The pack comprises an aluminum or an aluminum alloy and a halide activator catalyst which result in the formation of an aluminide layer on the surface of the substrate. The substrate may be in the pack or out of the pack.

b) an ion vapor deposition process to deposit a layer of aluminum can be used. This process may be carried out at 100° to 1200° C. in the pressure range of $10^{-7}$ to $10^{-4}$ atmospheres for a duration of 10 minutes to 10 hours resulting in the formation of the pure aluminum layer on the surface.

c) a chemical vapor deposition reaction from the reduction of an aluminum halide with processing carried out at 700° to 1200° C. and a pressure of $10^{-5}$ to 1 atmosphere with processing time of 10 minutes to 10 hours. The aluminum halides may be carried in an inert carrier or hydrogen.

d) electroplating from an aphotic solution containing an alkali metal ammonium salt and aluminum hydride coordinately bond to an amine (see G. Rudzki, Surface Finishing Systems, p. 62 (1983)).

e) electrophoretic paint deposition using an acrylic resin of low molecular weight, ammonia or a suitable organic amine, aluminum powder and a wetting agent (see T. P. Fisher, Surface Technology, 12, 107 (1981)).

f) chemical vapor deposition from aluminum alkyls with processing carried out at 200°-300° C. under atmospheric pressure with processing time of 10 minutes to 5 hours. The aluminum alkyls may be carried out by an inert gas.

The first and second steps may be carried out in any order. The last and third step comprises interdiffusion of the metallic element and the aluminum or aluminide layer into the substrate. It may be carried out in a vacuum or inert atmosphere with a processing temperature of 550° to 1200° C. and a processing time of 2 to 24 hours. A similar interdiffusion step may be carried out between the first and second steps. Furthermore, the interdiffusion may be carried out simultaneously with the final deposition step provided the time and temperatures used are appropriate. The result of all of the above processes is a coated layer comprising aluminum and the metallic element interdiffused and having a thickness of about 10 to 200 microns for these two layers.

Regarding the substrates which can be used in the present technique, applicants point out that any material is useful as a substrate provided that it is stable at the processing temperatures used.

One of the deposited layers on the substrate comprises aluminum or aluminide or mixtures thereof. The aluminide includes nickel, cobalt, iron and titanium aluminides.

The other layer which is deposited upon the substrate comprises a transition metal. The transition metals can include those of Group IIIB, IVB, VB, VIB, VIIB, VIII, IB and IVA of The Periodic Table of Elements, either alone or in combination. These can include, alone or in combination, platinum, rhodium, palladium, yttrium, scandium, zirconium, hafnium, silicon, lanthanum, chromium, tantalum, rhenium, manganese, titanium and gold. The preferred metal is platinum.

Again, the organometallic compound used for the deposition of the transition metals comprises complexes containing ligands such as hydrides, carbonyls, alkyls, alkenyls, $\pi$- and $\sigma$-allyls, arenes, $\pi$-olefins, silyls, etc., and any other suitable group. Examples are PtMe$_2$ (COD), PtMe($^5\eta$-C$_5$H$_5$)(COD); PtMe$_3$ ($^5\eta$-C$_5$H$_5$); Pt($^3\eta$-C$_3$H$_5$)$_2$; Y($^5\eta$-C$_5$H$_5$)$_3$; Pd($^3\eta$q-C$_3$H$_5$)$_2$; Ti(NMe$_2$)$_4$; Cr(CO)$_6$ and Re$_2$(CO)$_{10}$. The restriction upon the organometallic material is that as a result of the coating process, the deposited film is of substantially impurity-free transition metal whereby the organic material does not contaminate the film by its decomposition or otherwise to thereby facilitate the diffusion of the transition metal into the coated material and improve its oxidation resistance.

The invention envisions two distinct embodiments, one in which the substrate is first coated with the transition metal and then coated with the aluminum or aluminide compound. The second embodiment envisions that the substrate is first coated with the aluminum or aluminide compound and then coated with the transition metal. At all times the coating of the transition metal is achieved using chemical vapor deposition. Preferably this includes the use of an organometallic compound.

This is a critical feature of the invention which facilitates the coating of complex structures, including those having internal passages and facilitates the coating of aluminum/aluminide surfaces. Of course, the deposition steps can be used alternatively depending upon the embodiment being considered. Also, subsequent to each deposition, a diffusion step may be carried out. The diffusion step can be carried out simultaneously with the coating steps or subsequent to each of the deposition steps, or subsequent to both of them. Once the multicoated article is formed, subsequent layers can be included thereon. This can include alternating coating layers of the same or different materials.

The description of the invention will now be illustrated regarding certain examples that are not considered to limit the invention.

EXAMPLE 1

A sample of an IN738 nickel-base superalloy is mechanically cleaned and degreased in an organic solvent. It then has a commercial high temperature, low-activity aluminide layer applied by a pack cementation process. Subsequently, it is exposed to the complex dimethyl platinum cyclooctadiene, which is vaporized at 60° C. under hydrogen at a reduced pressure of $10^{-6}$ atmospheres. This complex decomposes on the sample substrate which is heated at 200° C. The sample is exposed to the process for twenty minutes resulting in the deposition of a 1 micron layer of 95% pure platinum with a 4% carbon impurity. The sample is then subjected to a diffusion treatment in vacuum of ½ hour at 870° C. and 1 hour at 1000° C. The above processing results in a coating with good adhesive properties and appearance. It is protective to the IN738 nickel-base superalloy substrate under conditions of hot corrosion.

EXAMPLE 2

A sample of IN738 nickel-base superalloy is mechanically cleaned and degreased in an organic solvent. The sample is then coated with platinum using the same process conditions as in Example 1. It is then processed with a commercial chromium modified aluminide coating by a pack cementation process. This results in a sample with good adhesion and appearance and a coating which is protective under hot corrosion conditions.

EXAMPLE 3

A sample of IN738 nickel-base superalloy is mechanically cleaned and degreased in an organic solvent. The sample is then coated at 250° C. and atmospheric pressure with a 20 $\mu$m aluminum layer by CVD of Al(iso-Bu)$_3$. Subsequently, yttrium is deposited at 280° C. by CVD of Y($^5\eta$-C$_5$H$_5$)$_3$ which is vaporized at 200° C. under $10^{-4}$ atmosphere of pressure. Finally, the sample is heat treated under He at 1100° C. for 2 hours to induce interdiffusion.

EXAMPLE 4

A sample of IN738 nickel-base superalloy is mechanically cleaned and degreased in an organic solvent. The sample is first coated at 280° C. with 1 m of scandium by CVD of ($^5\eta$-MeC$_5$H$_4$) Sc ($^8\eta$-C$_8$H$_8$) (sublimes at 160° C./$10^{-4}$ atm). A layer of 20 $\mu$m of Al is subsequently applied at 250° C. by atmospheric CVD of Al (iso-Bu)$_3$ followed by heat treatment under vacuum at 1100° C. for 2 hours to induce diffusion. Finally, 4 $\mu$m of Pd are applied at 250° C. by CVD of Pd ($^3\eta$-C$_5$H$_5$)$_2$ at $10^{-4}$ atm and the sample is heat treated again under vacuum at 900° C. for 2 hours.

Although the invention has been described in conjunction with specific embodiments, it is evident that many alternatives and variations will be apparent to those skilled in the art in light of the foregoing description. Accordingly, the invention is intended to embrace all of the alternatives and variations that fall within the spirit and scope of the appended claims.

We claim:

1. A coated product comprising a metal or alloy substrate having a first coating consisting of aluminum or aluminide or mixture thereof, and a second coating thereon of chemically vapor deposited yttrium or scandium.

2. A coated product comprising a metal or alloy substrate having a first coating of chemical vapor deposited yttrium or scandium and a second coating thereon consisting of aluminum or aluminide or mixture thereof.

* * * * *